(12) United States Patent
Lee (10) Patent No.: US 7,058,776 B2
(45) Date of Patent: Jun. 6, 2006

(54) ASYNCHRONOUS MEMORY USING SOURCE SYNCHRONOUS TRANSFER AND SYSTEM EMPLOYING THE SAME

(75) Inventor: Dong-Yang Lee, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 288 days.

(21) Appl. No.: 10/396,933

(22) Filed: Mar. 25, 2003

(65) Prior Publication Data

US 2004/0022095 A1    Feb. 5, 2004

(30) Foreign Application Priority Data

Jul. 30, 2002    (KR) ........................ 10-2002-0044982

(51) Int. Cl.
*G06F 12/00*    (2006.01)

(52) U.S. Cl. .................... 711/167; 711/105; 711/154; 365/193; 365/194

(58) Field of Classification Search ................ 711/104, 711/105, 167, 168, 169; 713/400, 401

See application file for complete search history.

(56) References Cited

U.S. PATENT DOCUMENTS

| | | | | |
|---|---|---|---|---|
| 6,047,361 A | * | 4/2000 | Ingenio et al. | 711/167 |
| 6,067,632 A | * | 5/2000 | Yamaguchi | 713/600 |
| 6,209,071 B1 | * | 3/2001 | Barth et al. | 711/167 |
| 6,311,285 B1 | | 10/2001 | Rodriguez et al. | |
| 6,336,159 B1 | | 1/2002 | MacWilliams et al. | |
| 6,477,110 B1 | * | 11/2002 | Yoo et al. | 365/233 |

* cited by examiner

*Primary Examiner*—Mano Padmanabhan
*Assistant Examiner*—Jasmine Song
(74) *Attorney, Agent, or Firm*—Myers Bigel Sibley & Sajovec PA

(57) ABSTRACT

A memory for storing data information and/or a controller for controlling read/write operations of the memory based on a source synchronous interface are provided. During the read/write operations, a command and an address are provided to the memory together with the first strobe signal. The memory may latch the command and address in response to the first strobe signal. During a read operation, the memory responds to a received second strobe signal to generate a third strobe signal. The memory outputs data from the memory and the third strobe signal, for example, so that the output data may be latched with the third strobe signal by the memory controller.

24 Claims, 5 Drawing Sheets

12
ASYNCHRONOUS MEMORY USING SOURCE SYNCHRONOUS TRANSFER AND SYSTEM EMPLOYING THE SAME

RELATED APPLICATIONS

This application claims priority from Korean Patent Application No. 2002-44982, filed on Jul. 30, 2002, the disclosure of which is incorporated herein by reference in its entirety.

1. Field of the Invention

The present invention is related to electronic devices, and, in particular, to a system that performs data transmission between a memory and a memory controller.

2. Background of the Invention

Integrated circuit memory devices are widely used in consumer and commercial applications. As is well known to those having skill in the art, integrated circuit memory devices include memory devices. Memory devices may include, but are not limited to, Dynamic Random Access Memory (DRAM) devices, Static Random Access Memory (SRAM) devices, Masked Read-Only Memory (MROM) devices, Programmable Read-Only Memory (PROM) devices, Erasable Programmable Read-Only Memory (EPROM) devices and Electrically Erasable Programmable Read-Only Memory (EEPROM) devices.

Various memory configurations have been utilized in conventional mobile processing systems such as Personal Communication Service (PCS), cellular, or Personal Digital Assistant (PDA). Such memory systems include non-volatile and volatile memories. Because mobile processing systems typically operate using a power supply voltage supplied from a battery, low-power operation of the memory system included in the mobile processing system may be beneficial. In particular, because mobile processing systems may spend much of their operational time in a standby state, memory systems that may provide low-power operation while the mobile processing system is in the standby state may also be beneficial.

The standby current generated in a conventional memory, such as a synchronous memory, having a clock tree structure may be substantially the same as that in a non-standby state. This may be the case because the clock signal is used as a transmission reference signal for synchronous memory operations and, therefore, the clock signal is, typically, internally produced irrespective of whether an operation is being performed by the synchronous memory.

As is known to those of skill in the art, a memory typically provides external communications with, for example, a memory controller or chipset, via pins (e.g., data pins, address pins, control pins, power pins, and so on). In a conventional mobile processing system, the memory and the memory controller are, typically, interconnected in a point-to-point fashion. Thus, large numbers of pins for interconnection may increase fabrication cost and/or complexity of a mobile processing system.

SUMMARY OF THE INVENTION

In accordance with certain embodiments of the present invention, there is provided systems, memories and/or methods of communicating with a memory that utilize a source synchronized interface. In some embodiments of the present invention, a memory is provided that stores data information and a controller is provided that controls read and write operations to/from the memory utilizing the source synchronous interface. In particular embodiments of the present invention, during the read and write operations, the controller transfers to the memory a command and an address together with a first strobe signal and the memory latches the command and address in response to the first strobe signal. During the read operation, the memory responds to a second strobe signal from the controller to generate a third strobe signal, and the controller receives data from the memory in response to the third strobe signal.

In still further embodiments of the present invention, a memory is provided that includes a first interface circuit that latches the command and address in response to the first strobe signal and a second interface circuit that outputs read data in response to the second strobe signal. The second interface circuit may also output the read data with a third strobe signal, wherein the third strobe signal is generated based on receipt of the second strobe signal. For write operations, the memory receives data to be written together with the second strobe signal for write operations. In certain embodiments of the present invention, the command and address are transferred in a packet format. The command and the address may also be transferred via different signal lines from each other. Similarly, the read data and the write data may be transferred on separate buses.

In accordance with further embodiments of the present invention, communications with an asynchronous memory are provided by receiving at the asynchronous memory a command, an address and a first strobe signal. The command and the address are each received at least partially concurrently with the first strobe signal. Data stored in the asynchronous memory is read from the memory based on the received command and the receive address. A second strobe signal is received at the asynchronous memory and a third strobe signal is generated in response to receipt of the second strobe signal. The data read from the asynchronous memory and the third strobe signal are output from the asynchronous memory. Furthermore, the data read from the asynchronous memory and the third strobe signal are at least partially concurrently output.

In further embodiments of the present invention, write data is received at least partially concurrently with receipt of the second strobe signal. The received write data is stored in the memory based on the received command and the receive address and the received second strobe signal. communications

DETAILED DESCRIPTION OF PREFERRED EMBODIMENTS

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout. It also will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
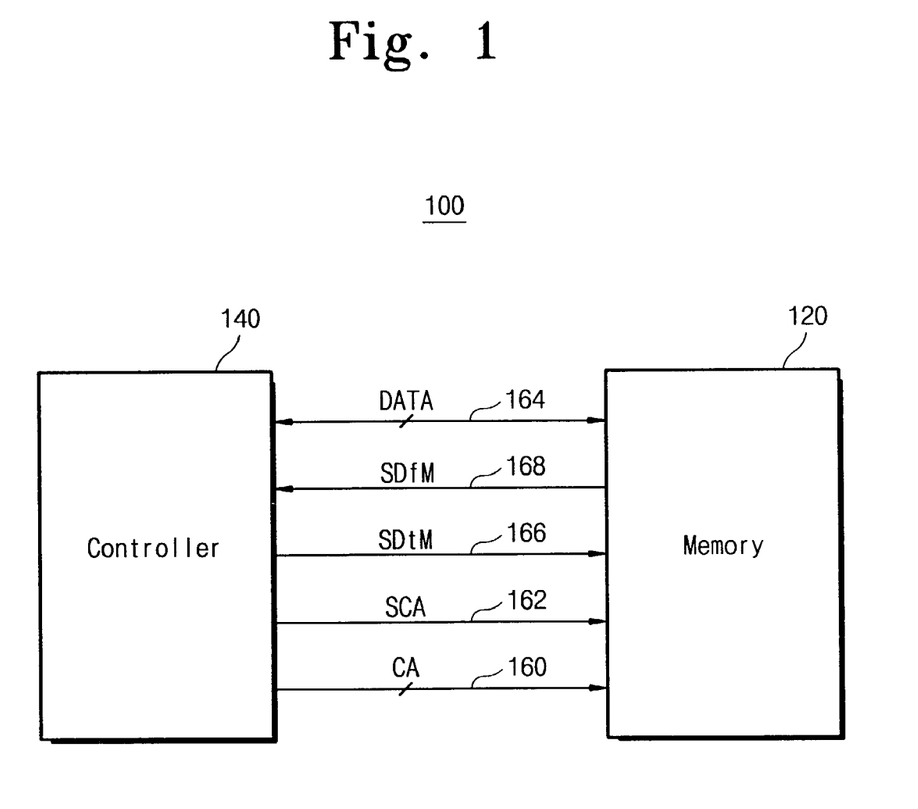
FIG. 1 is a block diagram of systems according to some embodiments of the present invention.

A block diagram of a system according to certain embodiments of the present invention is illustrated in FIG. 1. Referring to FIG. 1, a memory system 100 according to particular embodiments the present invention includes a memory 120 and a memory controller 140. The memory 120 is an asynchronous memory, and can be implemented using non-volatile memories (e.g., FRAM, EEPROM, EPROM, and so on) and volatile memories (e.g., DRAM, SRAM, and so on). With the memory system 100, data transmission between the memory 120 and the memory controller 140 is carried out by a source synchronous interface.

A source synchronous interface is an interface where data is sent from a transmitter to a receiver together with a clock signal, which is used within a receive interface to latch the accompanying data. Source synchronous interfaces may remove the limit of the time of flight on wire between a transmitter and a receiver and may not require controlled clock skew between the transmitter and the receiver. Source synchronous interfaces are disclosed in U.S. Pat. No. 6,311,285 entitled "METHOD AND APPARATUS FOR SOURCE SYNCHRONOUS TRANSFERS AT FREQUENCIES INCLUDING ODD FRACTION OF A CORE FREQUENCY" and U.S. Pat. No. 6,336,159 entitled "METHOD AND APPARATUS FOR TRANSFERRING DATA IN SOURCE-SYNCHRONOUS PROTOCOL AND TRANSFERRING SIGNALS IN COMMON CLOCK PROTOCOL IN MULTIPLE AGENT PROCESSING SYSTEM," the disclosures of which are incorporated herein by reference as if set forth fully herein.

As is further illustrated in FIG. 1, the memory controller 140 sends command/address information CA for a read/write operation to the memory 120 via a control bus 160. The memory controller 140 sends the first strobe signal SCA as a transmission reference or synchronous signal to the memory 120 via a signal line 162. That is, the command/address information CA is transferred to the memory 120 from the memory controller 140 together with the first strobe signal SCA based on the source synchronous interface. The memory 120 latches the command/address information CA in response to the first strobe signal SCA.

For a write operation, in addition to the command/address information CA, the memory controller 140 transfers data DATA to the memory 120 via a data bus 164, and transfers, as a transmission synchronous signal, the second strobe signal SDtM to the memory 120 via a signal line 166. In particular, for a write operation, the write data DATA is sent to the memory 120 from the memory controller 140 together with the second strobe signal SDtM based on the source synchronous interface. The memory 120 latches the write data DATA in response to the second strobe signal SDtM.

For a read operation, in addition to the command/address information CA, the memory controller 140 transfers to the memory 120 the second strobe signal SDtM as a transmission synchronous or reference signal at a time when it wants to receive data read out from the memory 120. The memory 120 internally generates a third strobe signal SDfM in response to the second strobe signal SDtM. The read data that is read from the memory 120 is sent to the memory controller 140 together with the third strobe signal SDfM. Therefore, during the read operation the memory controller 140 receives the read data DATA from the memory 120 together with the third strobe signal SDfM at a required time, by sending the second strobe signal SDtM to the memory 120 after it transmits the command and address information to the memory 120.

In some embodiments of the present invention, the command and address information is transmitted in a packet format. Thus, for example, a control bus 160 may be formed of three control bus lines. If the address and the command are transferred via separate transmission lines, the control bus 160 may be formed of a dedicated command bus and a dedicated address bus. In embodiments of the present invention where the address and command information is transmitted in a packet format, the number of control and address pins may be reduced over that of a conventional memory, such as a DRAM. Accordingly a memory 120 according to come embodiments of the present invention can be implemented using fewer pins than a conventional memory.

For example, the bandwidth of a memory may be determined as the multiplication of an operating frequency of the memory and the number of data pins. Thus, for example, the bandwidth of a memory having a bit organization of ×16 that operates at 200 Mbps is equal to that of a memory having a bit organization of ×4 that operates at 800 Mbps. Therefore, the number of data pins can be reduced without reducing the bandwidth of the memory.

Figure 2:
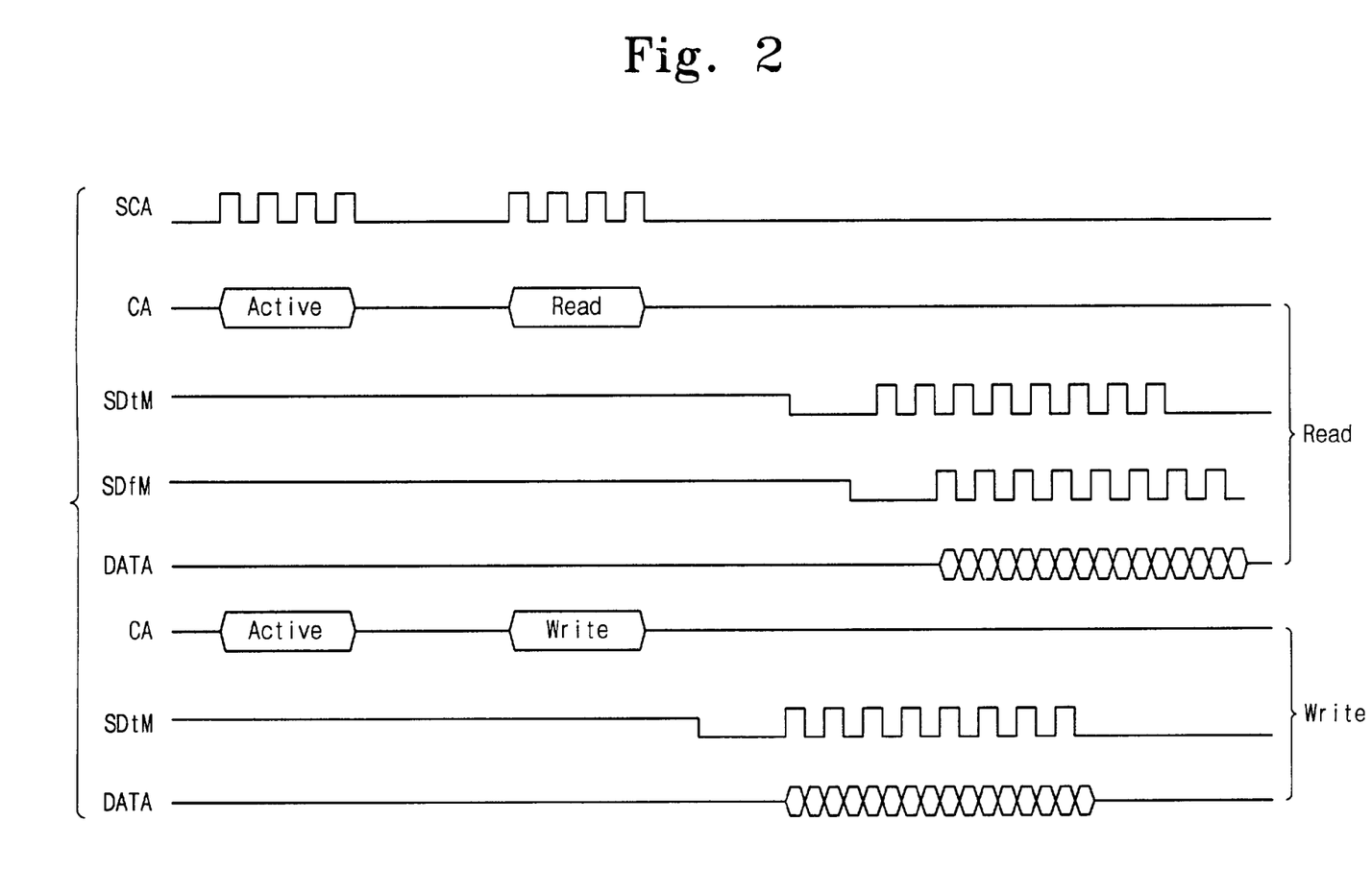
FIG. 2 is a timing diagram of data transmission operations according to some embodiments of the present invention.

Data transmission operations according to some embodiments of the present invention are illustrated in FIG. 2. The upper portion of FIG. 2, labeled Read, illustrates an operation for reading data from a memory 120 and sending the data to a memory controller 140. To read data from the memory 120, an active command Active (e.g., a row address) is sent to the memory 120 from the memory controller 140. This is accomplished by toggling the first strobe signal SCA during a predetermined time, for example, when the active command Active has been placed on the CA bus. Such operations are illustrated in FIG. 2, as the memory controller 140 loads the active command Active on a control bus 160 (identified as CA in FIG. 2) and toggles the first strobe signal SCA while the active command Active is on the control bus 160. The memory 120 latches the active command Active in response to toggling of the first strobe signal SCA. The memory controller 140 the loads the read command Read (e.g., a column address) on the control bus 160 and toggles the first strobe signal SCA while the read command Read is on the control bus 160. The memory 120 latches the read command Read in response to toggling of the first strobe signal SCA.

Responsive to receipt of the active command Active and the read command Read, the data stored in the memory 120 may be read from memory utilizing conventional read operations. For example, data stored in a memory cell array (not shown) is read out via a read circuit (e.g., a sense amplifier circuit). The read data is transferred to the memory controller 140 from the memory 120 via a data bus 166, based on the control of the memory controller 140. To send data read from the memory 120 to the memory controller 140, first, the memory controller 140 transfers the second strobe signal SDtM to the memory 120. The memory 120 generates the third strobe signal SDfM in response to the received second strobe signal SDtM. The third strobe signal SDfM, as illustrated in FIG. 2, may have the same waveform as the second strobe signal SDtM delayed by a predetermined time. The memory 120 loads data on the data bus 166 (illustrated as DATA in FIG. 2) in response to the second strobe signal SDtM and outputs the third strobe signal SDfM while the data is loaded on the data bus 166. The memory controller 140 latches data DATA loaded on the data bus 166 in response to the third strobe signal SDfM.

A write operation from the memory controller 140 to the memory 120 is also illustrated in the lower portion of FIG. 2. During a write operation where data is written to the memory 120, first, an active command Active'(e.g., a row address) is sent to the memory controller 140 from the memory 120. The active command Active' is sent to the memory 120 by the memory controller 140 toggling the first strobe signal SCA during a predetermined time, for example, when the active command Active' is on the control bus 160 (illustrated as CA in FIG. 2). That is, the memory controller 140 loads the active command Active' on the control bus 160 and toggles the first strobe signal SCA while the command is on the control bus 160. The memory 120 latches the active command Active in response to toggling of the first strobe signal SCA. The memory controller 140 subsequently loads the write command Write (e.g., a column address) on the control bus 160 and toggles the first strobe signal SCA while the write command Write is on the control bus 160. The memory 120 latches the write command Write in response to toggling of the first strobe signal SCA.

The data to be written is then sent from the memory controller 140 to the memory 120. Data transmission is accomplished by toggling the second strobe signal SDtM. That is, the memory controller 160 loads the write data DATA on the data bus 166 and toggles the second strobe signal SDtM while the write data DATA is on the data bus 166. The memory 120 latches the write data DATA in response to the second strobe signal SDtM. The latched write data may be stored in a memory cell array (not shown) utilizing conventional techniques. For example, the latched data may be stored in the memory cell array via a write circuit (e.g., a write driver circuit).

The memory 120 operates in an asynchronous fashion, for example, a fashion using a conventional technique that utilizes a delay chain as a state machine. Furthermore, as is seen from the discussion above, the strobe signals SCA and SDtM that are used as transmission synchronous signals are only toggled when a transfer is occurring. Thus, the need for a continuous clock may be avoided and the current consumed by the memory 120 when not performing a read or write operation may be reduced over a similar memory that utilizes a continuous clock.

Figure 3:
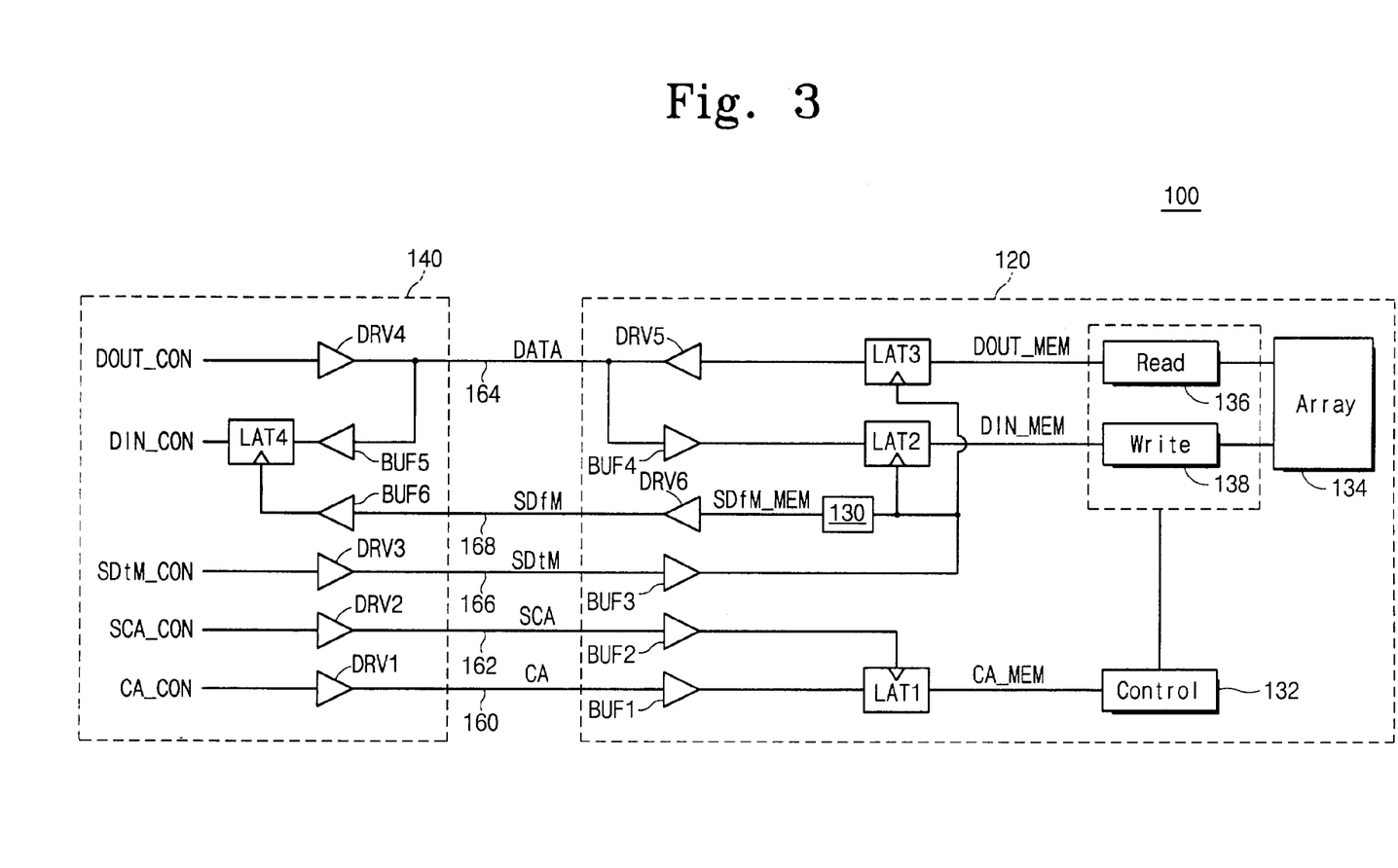
FIG. 3 is a block diagram of a memory and a memory controller according to some embodiments of the present invention.

FIG. 3 is a block diagram of particular embodiments of a memory 120 and a memory controller 140 illustrated in FIG. 1. One control bus line and one data bus line are illustrated in FIG. 3, however, those skilled in the art will appreciate that more control and data bus lines are included in the system 100. In FIG. 3, input/output interface circuits of a memory controller 140 are illustrated, however, additional function of the memory controller may be provided, for example, to control the generation of the signals SDtM_CON, SCA_CON, and CA_CON and the generate and receive the data signals DOUT_CON and DIN_CON. Thus, the interface circuit of the memory controller 140 may be utilized with a conventional chipset to provide the complete functionality of the memory controller 140. Alternatively, a custom chipset may be utilized to provide the functionality of memory controller 140. Such custom chipset may provide, for example, a state machine or other control circuit that generates the signals as described herein for performing read and write operations from/to the memory 120.

Referring to FIG. 3, a driver DRV1 of the memory controller 140 transfers internally generated command/address information CA_CON to a control bus line 160, and a driver DRV2 transfers internally generated strobe signal SCA_CON to a signal line 162. An input buffer BUF1 of the memory 120 buffers the command/address information CA transferred from the memory controller 140 via the control bus line 160. An input buffer BUF2 buffers the first strobe signal SCA sent from the memory controller 140 via the signal line 162. A latch LAT1 latches the output of the input buffer BUF1 in response to the first strobe signal SCA buffered by the input buffer BUF2. An output CA_MEM of the latch LAT1 is provided to a control circuit 132. The buffers BUF1 and BUF2 and the latch LAT1 form an interface circuit of the memory 120.

As is illustrated in FIG. 3, the second strobe signal SDtM_CON generated by the memory controller 140 is sent to a signal line 166 via a driver DRV3. An input buffer BUF3 of the memory 120 buffers the second strobe signal SDtM transferred from the memory controller 140 via the signal line 166. A driver DRV4 of the memory controller 140 provides the data DOUT_CON to be stored in the memory 120 to a data bus line 164. An input buffer BUF4 of the memory 120 buffers the received data DATA sent via the data bus line 164. A latch LAT2 latches data output from the input buffer BUF4 in response to the second strobe signal SDtM that is buffered via the input buffer BUF3. An output DIN_MEM of the latch LAT2 is provided to a write circuit 138 to write the latched data to a memory cell array 134. The write circuit 138 is controlled by the control circuit 132.

As is further illustrated in FIG. 3, a latch LAT3 latches data DOUT_MEM read out of the memory array 134 by a read circuit 136 in response to an output of the input buffer BUF3. Thus, the second strobe signal SDtM received by the memory 120 is used to latch the data read from the memory array 134. The latched data is provided to a data bus line 164 via a driver DRV5. The read circuit 136 is controlled by the control circuit 132.

In FIG. 3, a strobe generation circuit 130 generates the third strobe signal SDfM_MEM in response to the second strobe signal SDtM output by the input buffer BUF3. For example, in certain embodiments of the present invention, the strobe generation circuit 130 delays the second strobe signal SDtM a delay time associated with operation of the latch LAT3 to generate the third strobe signal SDfM. Thus, the strobe generation circuit may be a delay line, phase or delay locked loops, an oscillator or other such strobe generation circuits known to those of skill in the art. A driver DRV6 of the memory 120 transfers an output SDfM_MEM of the strobe generation circuit 130 to a signal line 168. An input buffer BUF5 of the memory controller 140 buffers data DATA on the data bus line 164, and an input buffer BUF6 thereof buffers the third strobe signal SDfM transferred via the signal line 168. A latch LAT4 latches the output of the input buffer BUF5 in response to the third strobe signal SDfM buffered via the input buffer BUF6. The output DIN_CON of the latch LAT4 is transferred to an internal circuit (not shown) of the memory controller 140. The driver DRV5, the input buffer BUF4, and the latches LAT2 and LAT3 form an interface circuit of the memory controller 140.

As is discussed above, typically, the amount of current consumed by a memory system in a standby state results from the clock signal used to synchronize operations of a synchronous memory. If the memory uses the clock signal as an operation reference signal, the clock signal, typically, continues to be generated even while in the standby state. Thus, internal circuits that us or generate the clock signals continue to operate and consume current. However, according to embodiments of the present invention, as illustrated for example in FIG. 3, the strobe signals, such as SCA and SDtM, that are used as transmission references or synchronous signals, are used in the memory 120 only as a latch enable or latching signal. That is, the strobe signals SCA and SDtM are not used as a reference signal (e.g., a clock signal) for a memory operation. This means that the memory 120 performs read and write operations in an asynchronous manner, for example, using a delay chain as a state machine. Accordingly, certain embodiments of the present invention may be capable of reducing the standby current consumed in the memory 120 as no clocks need be generated or utilized as a reference signal for the operations to the memory array.

According to embodiments of the present invention, the strobe signals SCA and SDtM can be provided by any method known to those of skill in the art that provide the signal as described herein. For example, a strobe signal can be implemented using a clock signal that is toggled only during a desired period, for example, when data is on the CA bus or the DATA bus. Alternatively, the strobe signal can be implemented so as to have a preamble interval and a valid interval. For example, as illustrated in FIG. 2, a strobe signal is set to a low level (or a high level) during the preamble interval so that the driver and/or the input buffer is activated, and is toggled during the valid interval. At this time, a latch latches information loaded on the control/data bus in response to the toggled strobe signal, as valid information.

Figure 4:
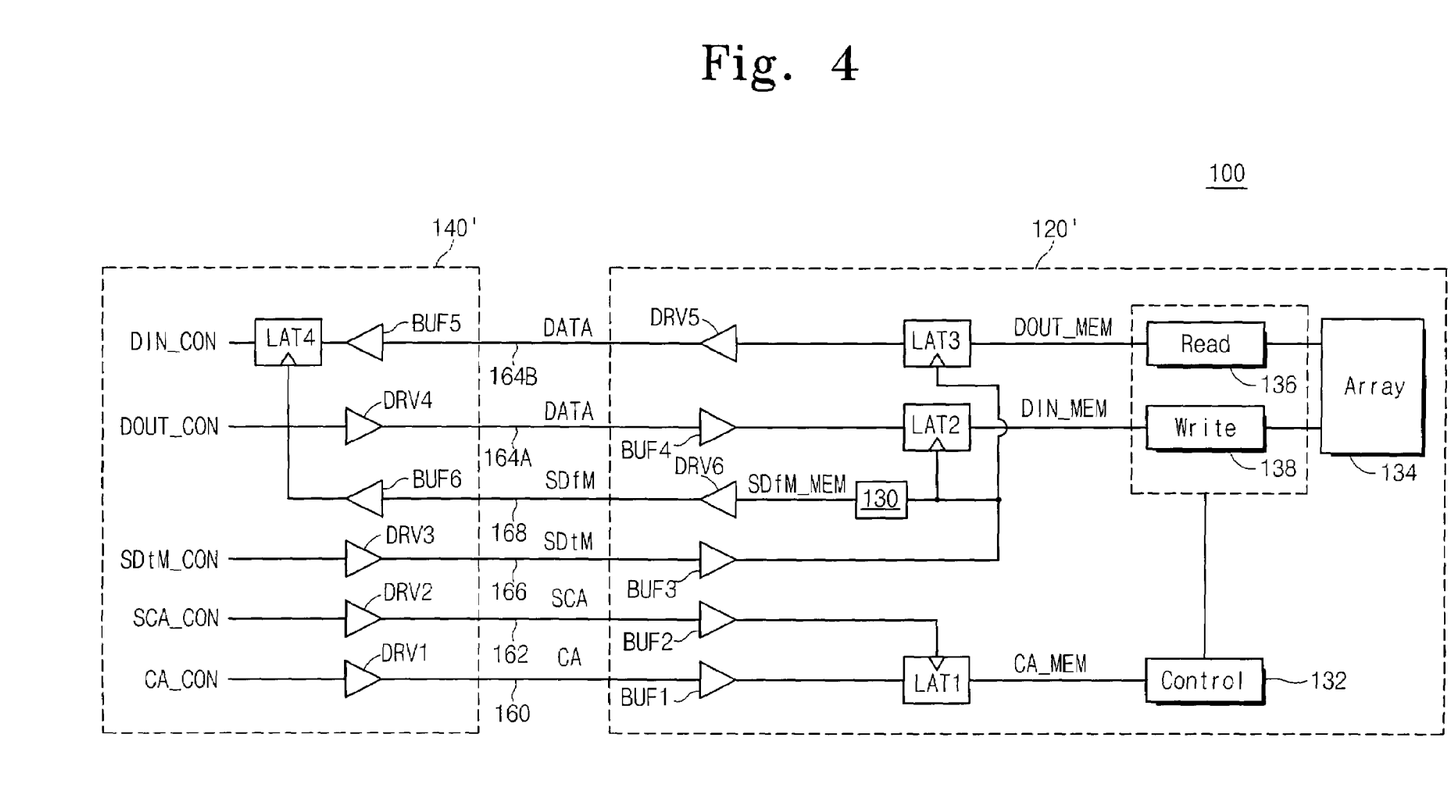
FIG. 4 is a block diagram of a memory and a memory controller according to further embodiments of the present invention.

FIG. 4 illustrates a memory 120' and a memory controller 140' according to further embodiments of the present invention. In FIG. 3 data transmission between the memory 120' and the memory controller 140' is performed using the same data bus. However, as illustrated in FIG. 4, a data bus 164A that is used when data is sent to the memory controller 140' from the memory 120' is separated from a data bus 164A that is used when data is sent to the memory 120' from the memory controller 140. That is, the data bus 164A is used for write operations while the data bus 164B is used for read operation. Thus, the data bus 164A is driven by the driver DRV4 and provided through the buffer BUF4 to the latch LAT2 to latch write data using the strobe SDtM. The data bus 164B is driven by the driver DRV5 and provide through the buffer BUF5 to the latch LAT4 to latch the read data using the strobe SDfM. Otherwise, the memory 120' and the memory controller 140' in FIG. 4 and their operation are substantially identical to those of the memory 120 and the memory controller 140 discussed above with reference to FIG. 3.

Figure 5:
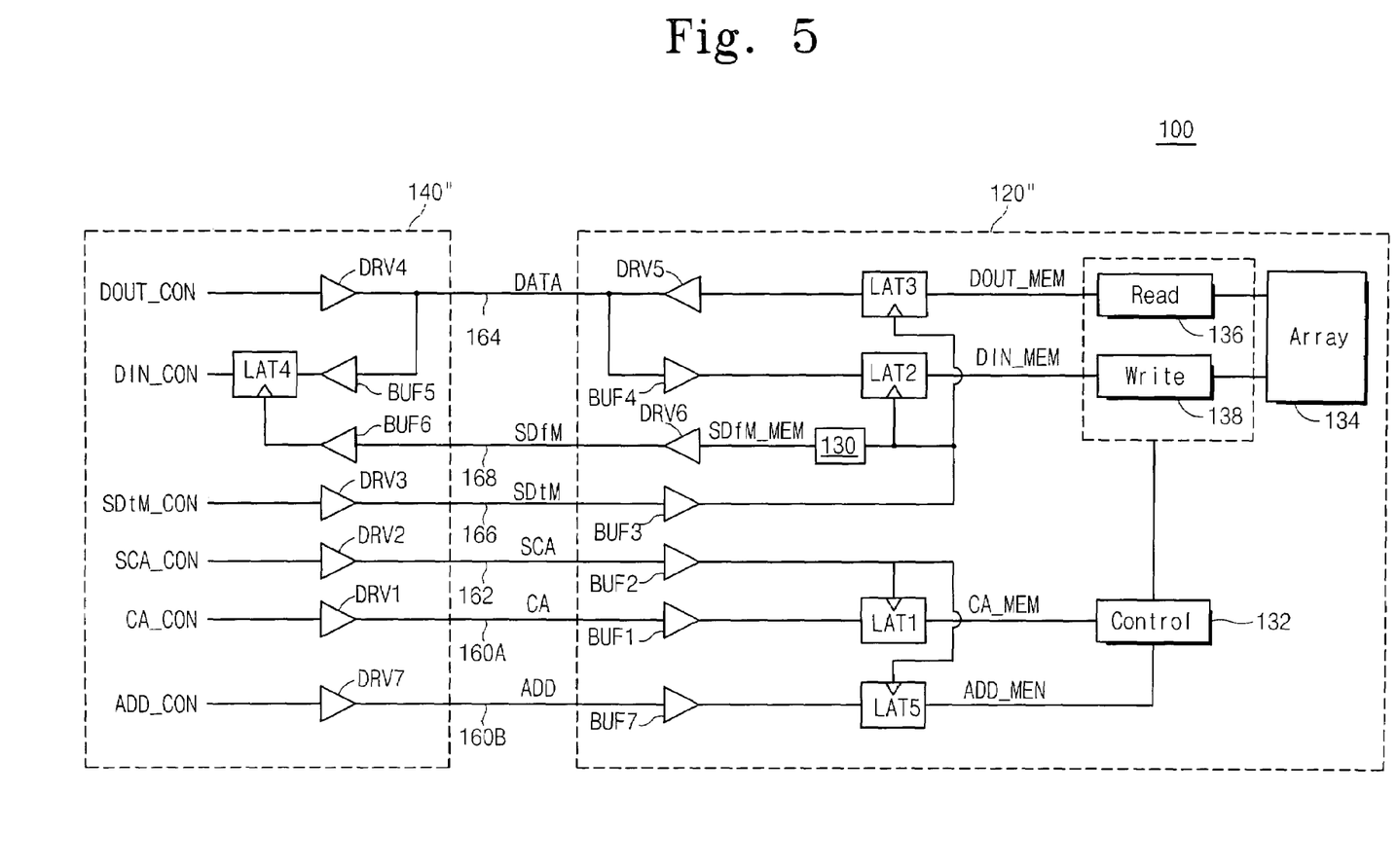
FIG. 5 is a block diagram of a memory and a memory controller according to further embodiments of the present invention.

FIG. 5 illustrates a memory 120" and a memory controller 140" according to other embodiments of the present invention. As discussed above with reference to FIG. 3, in certain embodiments of the present invention, the address and command information are transferred via the same control bus 160. However, in the embodiments of the present invention illustrated in FIG. 5, the address and the command information are transferred via different buses. For example, a driver DRV1 of the memory controller 140" transfers an internally generated command CMD_CON to a bus 160A, and an input buffer BUF1 of the memory 120" buffers the command CMD transferred via the bus 160A. A latch LAT1 latches the buffered command, and the output CMD_MEM of the latch LAT1 is transferred to a control circuit 132. A driver DRV7 of the memory controller 140 transfers an internally generated address ADD_CON to a bus 160B, and an input buffer BUF7 of the memory 120 buffers the address ADD transmitted via the bus 160B. A latch LAT5 latches the buffered address, and the output ADD_MEM of the latch LAT5 is transferred to the control circuit 132. Otherwise, the memory 120" and the memory controller 140" in FIG. 5 and their operation are substantially identical to those of the memory 120 and the memory controller 140 discussed above with reference to FIG. 3.

As will be further appreciated by those of skill in the art in light of the present disclosure, embodiments of the present invention may also include memories and/or memory controllers that utilized both separate read and write data buses and separate address and command buses. Thus, for example, the memories and memory controllers of FIGS. 4 and 5 could be combined to provided further embodiments of the present invention.

In some embodiments of the present invention, strobe signals can be controlled so as to be toggled only when data or an address is transmitted or before the data and address are transmitted. Alternatively, strobe signals can be controlled so as to continue to be toggled.

Embodiments of the present invention have been described with reference to particular interface circuits for memory controllers and memories. For clarity, such memory controllers, memories and interface circuits have been presented in a simplified form. Thus, additional circuits that will be readily apparent to those of skill in the art in light of the present invention may also be included in memory controllers, memories and/or systems according to embodiments of the present invention. For example, a direction control circuit may be provided so as to control the direction of the drivers DRV4 and DRV5 so as to disable appropriate ones of the drivers when data is being received by the memory controller 140 or the memory 120 of FIG. 3. Similarly, as discussed above, in certain embodiments of the present invention, the internal buses of the memory 120 and/or the memory controller 140 may be wider than one or more of the command, address and/or data busses. Accordingly, additional circuitry for packetizing the data from a wider bus to a narrower bus and de-packetizing the data from the narrow bus to the wider bus may also be provided. Other modifications and/or details of memory devices, memory controllers and/or systems will be apparent to those of skill in the art in light of the present disclosure and, therefore, are not described in detail herein. However, certain embodiments of the present invention are intended to encompass such modifications and details.

The invention has been described using exemplary embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. An asynchronous semiconductor memory device comprising:

a memory array configured to store data information;

a first interface circuit configured to latch command and address information in response to a first strobe signal received by the asynchronous semiconductor memory device;

a read circuit configured to read data information from the memory array in response to the latched command and address information;

a signal generator circuit configured to generate a third strobe signal in response to a second strobe signal received by the asynchronous semiconductor memory device; and a second interface circuit configured to latch data read from the array by the read circuit in response to the second strobe signal and further configured to output the latched data to external the asynchronous semiconductor memory device and also output the third strobe signal to external the asynchronous semiconductor memory device at least partially concurrently with the output of the latched data.

2. The asynchronous semiconductor memory device according to claim 1, wherein the second interface circuit is further configured to latch data information to be stored in the memory array in response to the second strobe signal.

3. The asynchronous semiconductor memory device according to claim 1, wherein the command and address information are transferred in a packet format.

4. A system comprising:

a memory configured to store data information and further configured to latch command and address information in response to receipt of a first strobe signal, to latch write data in response to receipt of a second strobe signal for a write operation and to generate a third strobe signal in response to the second strobe signal and output read data and the generated third strobe signal for a read operation; and a controller configured to control the read and write operations of the memory, the controller being further configured to transfer to the memory the command and address information together with the first strobe signal, transfer write data to the memory together with the second strobe for a write operation and transfer the second strobe to the memory and receive the read data together with the third strobe output from the memory for a read operation.

5. The system according to claim 4, wherein the memory includes:

a first interface circuit configured to latch the command and address in response to the first strobe signal; and a second interface circuit configured to output the read data to the controller in response to receipt of the second strobe signal.

6. The system according to claim 5, wherein the second interface circuit is further configured to output the generated third strobe signal with the read data.

7. The system according to claim 4, wherein the command information and the address information are transmitted on separate buses.

8. The system according to claim 4, wherein the read data and the write data are transmitted on separate buses.

9. The system according to claim 4, wherein the command and address are transferred in a packet format.

10. The system according to claim 4, wherein the third strobe and the read data are transferred at least partially concurrently.

11. A system comprising:

an asynchronous memory having a first interface circuit which receives a command and an address in response to a first strobe signal, a second interface circuit that receives data in response to a second strobe signal, and a strobe signal generator circuit that generates a third strobe signal in response to the second strobe signal; and a memory controller that generates the first and the second strobe signals and receives the third strobe signal and read data from the asynchronous memory in response a read command issued to said asynchronous memory.

12. The system according to claim 11, wherein the first, second and third strobe signals are toggled when the command, address and data are transferred.

13. The system according to claim 11, wherein the command and the address are transferred in a packet format.

14. The system according to claim 11, wherein the command and the address are transferred via different signal lines from each other.

15. The system according to claim 11, wherein the third strobe signal and the data from the asynchronous memory are transferred at least partially concurrently.

16. A system comprising:

an asynchronous memory; and a memory controller that generates first and second strobe signals;

wherein the asynchronous memory includes:
a memory array that stores data information;
a first interface circuit that latches command and address information in response to the first strobe signal;
a read circuit that reads data from the array in response to the latched command and address information;
a signal generator circuit that delays the second strobe signal to generate a third strobe signal; and
a second interface circuit that latches data read by the read circuit in response to the second strobe signal, the latched data in the second interface circuit being transferred to the memory controller together with the third strobe signal.

17. The system according to claim 16, wherein the first, the second and the third strobe signals are toggled when the data, command and address are transferred.

18. The system according to claim 16, wherein the command and the address are transferred in a packet format.

19. The system according to claim 16, wherein the command and the address are transferred via different signal lines from each other.

20. A method of communicating with an asynchronous memory, the method comprising:

receiving at the asynchronous memory a command, an address and a first strobe signal wherein the command and the address are each received at least partially concurrently with the first strobe signal;

reading data stored in the asynchronous memory based on the received command and the received address;

receiving a second strobe signal at the asynchronous memory;

generating, at the asynchronous memory, a third strobe signal in response to the second strobe signal; and outputting from the asynchronous memory, the data read from the asynchronous memory and the third strobe signal, wherein the data read from the asynchronous memory and the third strobe signal are at least partially concurrently output.

21. The method according to claim 20, wherein the first, the second and the third strobe signals are each toggled only during read and/or write operations.

22. The method according to claim 20, wherein the command and address are received by receiving data packets having command and/or address information.

23. The method according to claim 20, wherein the command information and the address information are transferred via different signal lines from each other.

24. The method according to claim 20, further comprising:

receiving write data at least partially concurrently with receipt of the second strobe signal; and storing the received write data based on the received command and the receive address and the received second strobe signal.

* * * * *